US 6,714,476 B2

(12) United States Patent
Hsu et al.

(10) Patent No.: US 6,714,476 B2
(45) Date of Patent: Mar. 30, 2004

(54) MEMORY ARRAY WITH DUAL WORDLINE OPERATION

(75) Inventors: Louis L. Hsu, Fishkill, NY (US); Rajiv V. Joshi, Yorktown Heights, NY (US); Fariborz Assaderaghi, Mahopac, NY (US)

(73) Assignee: IBM Corporation, Armonk, NY (US)

( * ) Notice: Subject to any disclaimer, the term of this patent is extended or adjusted under 35 U.S.C. 154(b) by 97 days.

(21) Appl. No.: 09/783,918

(22) Filed: Feb. 15, 2001

(65) Prior Publication Data
US 2002/0138688 A1 Sep. 26, 2002

(51) Int. Cl.[7] .................................................. G11C 8/00
(52) U.S. Cl. .............. 365/230.03; 365/149; 365/230.06
(58) Field of Search ............................. 365/230.03, 149, 365/230.01, 129, 230.06

(56) References Cited

U.S. PATENT DOCUMENTS 5,862,095 A * 1/1999 Takahashi et al. .......... 365/222
6,272,054 B1 * 8/2001 Barth et al. ............. 365/189.06
6,344,990 B1 * 2/2002 Matsumiya et al. .......... 365/63
6,449,204 B1 * 9/2002 Arimoto et al. ............. 365/222

* cited by examiner

Primary Examiner—Hoai Ho
(74) Attorney, Agent, or Firm—Dilworth & Barrese LLP

(57) ABSTRACT

A DRAM array is provided capable of being interchanged between single-cell and twin-cell array operation for storing data in a single-cell or a twin-cell array format, respectively. Preferably, the DRAM array is operated in the single-cell array format during one operating mode and the DRAM array is operated in the twin-cell array format during another operating mode. Wordline decoding circuitry is included for interchanging the DRAM array between single-cell and twin-cell array operation. The wordline decoding circuitry includes a pre-decoder circuit for receiving a control signal and outputting logic outputs to wordline activation circuitry. The wordline activation circuitry then activates at least one wordline traversing the array for interchanging memory cells within the DRAM array between single-cell array operation and twin-cell array operation. Methods are also provided for converting data stored within the DRAM array from the single-cell to the twin-cell array format, and vice versa.

16 Claims, 4 Drawing Sheets

MEMORY ARRAY WITH DUAL WORDLINE OPERATION

FIELD OF THE INVENTION

This invention relates to the field of integrated circuit (IC) design. Specifically, it relates to a dynamic random access memory (DRAM) array interchangeable between single-cell and twin-cell array operation.

BACKGROUND OF THE INVENTION

Each memory cell in a dual-port static random access memory (SRAM) chip is a buffer or flip-flop, and data is retained as long as power is maintained to the chip. SRAMs are realized with a bipolar technology, such as TTL, ECL, or $I^2L$ or with MOS technology, such as NMOS or CMOS. Bipolar SRAMs are relatively fast, having access times of 10 to 100 nsec. Power dissipation is also high, typically, 0.1 to 1.0 mW/bit. By contrast, MOS RAM access time is typically 100 nsec and power dissipation is 25 $\mu$W/bit. The combination of high circuit density, low power dissipation, and reasonable access time has led to the dominance of MOS technology in the manufacture of RAM. Hence, dual-port SRAMs having high-speed buffers are widely used in devices and equipment necessitating high-speed and high performance, such as microprocessors, communication networks, facsimile machines, modems, etc.

Since the memory cells of SRAMs take up a relatively large surface area on a single integrated (IC) chip, IC design engineers, in an effort to increase the number of memory cells on the IC chip, i.e., high density, and make the chip smaller, have focused on improving dynamic RAM (DRAM) chips to make them suitable for high-speed, high performance devices and equipment. Currently, the ultimate in achieving high-density and compactness, is a DRAM chip capable of storing data in the single-cell array format where each memory cell uses a capacitor to store a charge and one transistor to gate it to sense amplifier circuits.

Nonetheless, the single-cell storage configuration does not have a low-operating voltage, does not consume low-power, does not retain data for long periods of time, and is not suitable for high-speed, high-performance applications, as compared to a DRAM chip capable of storing data in the twin-cell array format. Accordingly, it is envisioned to provide a DRAM array capable of storing data in both the single-cell and twin-cell array format, where the DRAM array is interchangeable between single-cell and twin-cell array operation.

SUMMARY

An aspect of the present invention is to provide a DRAM array capable of storing data in both the single-cell and twin-cell array format, where the DRAM array is interchangeable between single-cell and twin-cell array operation.

Another aspect of the present invention is to provide a DRAM array capable of storing data in both the single-cell and twin-cell array format, where the operating voltage of the DRAM array is reduced when the data is stored in the twin-cell array format.

Further, another aspect of the present invention is to provide a DRAM array capable of storing data in both the single-cell and twin-cell array format, where the refresh period of the DRAM array is extended when the DRAM array is operated as a twin-cell array, as compared to when the DRAM array is operated as a single-cell array.

Further still, another aspect of the present invention is to provide a DRAM array capable of storing data in both the single-cell and twin-cell array format, where data can be converted from the single-cell array format to the twin-cell array format, and vice versa.

Finally, another aspect of the present invention is to provide a DRAM array capable of storing data in both the single-cell and twin-cell array format, where, during one operating mode, e.g., an active mode, the DRAM array is operated as a single-cell array, while, during another operating mode, e.g., a low-power mode, the DRAM array is operated as a twin-cell array.

Accordingly, in an embodiment of the present invention, a DRAM array is provided capable of being interchanged between single-cell and twin-cell array operation for storing data in the single-cell or the twin-cell array format, respectively. Preferably, the DRAM array is operated in the single-cell array format during one operating mode and the DRAM array is operated in the twin-cell array format during another operating mode.

Wordline decoding circuitry is included for interchanging the DRAM array between single-cell and twin-cell array operation. The wordline decoding circuitry includes a predecoder circuit for receiving a control signal and outputting logic outputs to wordline activation circuitry. The wordline activation circuitry then activates at least one wordline traversing the array for interchanging memory cells within the DRAM array between single-cell array operation and twin-cell array operation.

Methods are also provided for converting data stored within the DRAM array from the single-cell to the twin-cell array format, and vice versa. A method for converting data from a single-cell array format to a twin-cell array format includes the steps of activating a first wordline traversing a data array; reading data stored within a first group of cells of the data array which are coupled to the first wordline to corresponding sense amplifiers; and activating at least a second wordline traversing the data array to write the data from the corresponding sense amplifiers to a second group of cells of the data array.

A method for converting data from a twin-cell array format to a single-cell array format includes the steps of activating at least a first wordline traversing a data array; reading data stored within a first group of cells of the data array which are coupled to the at least first wordline to corresponding sense amplifiers; and activating a second wordline traversing the data array to write data from the corresponding sense amplifiers to a second group of cells of the data array.

DETAILED DESCRIPTION OF THE INVENTION

The present invention provides a DRAM array capable of being interchanged between single-cell and twin-cell array operation for storing data in the single-cell or the twin-cell array format, respectively. Preferably, the DRAM array is operated in the single-cell array format during one operating mode, e.g., in an active mode, and the DRAM array is operated in the twin-cell array format during another operating mode, e.g., in a low-power mode.

Methods are also provided for converting data stored within the DRAM array from the single-cell to the twin-cell array format, and vice versa. It is contemplated that other types of memory arrays, such as SRAM and TRAM arrays, can be implemented for storing data in the single-cell and the twin-cell array format and for performing data conversion from one array format to another according to the principles of the present invention.

Figure 2:
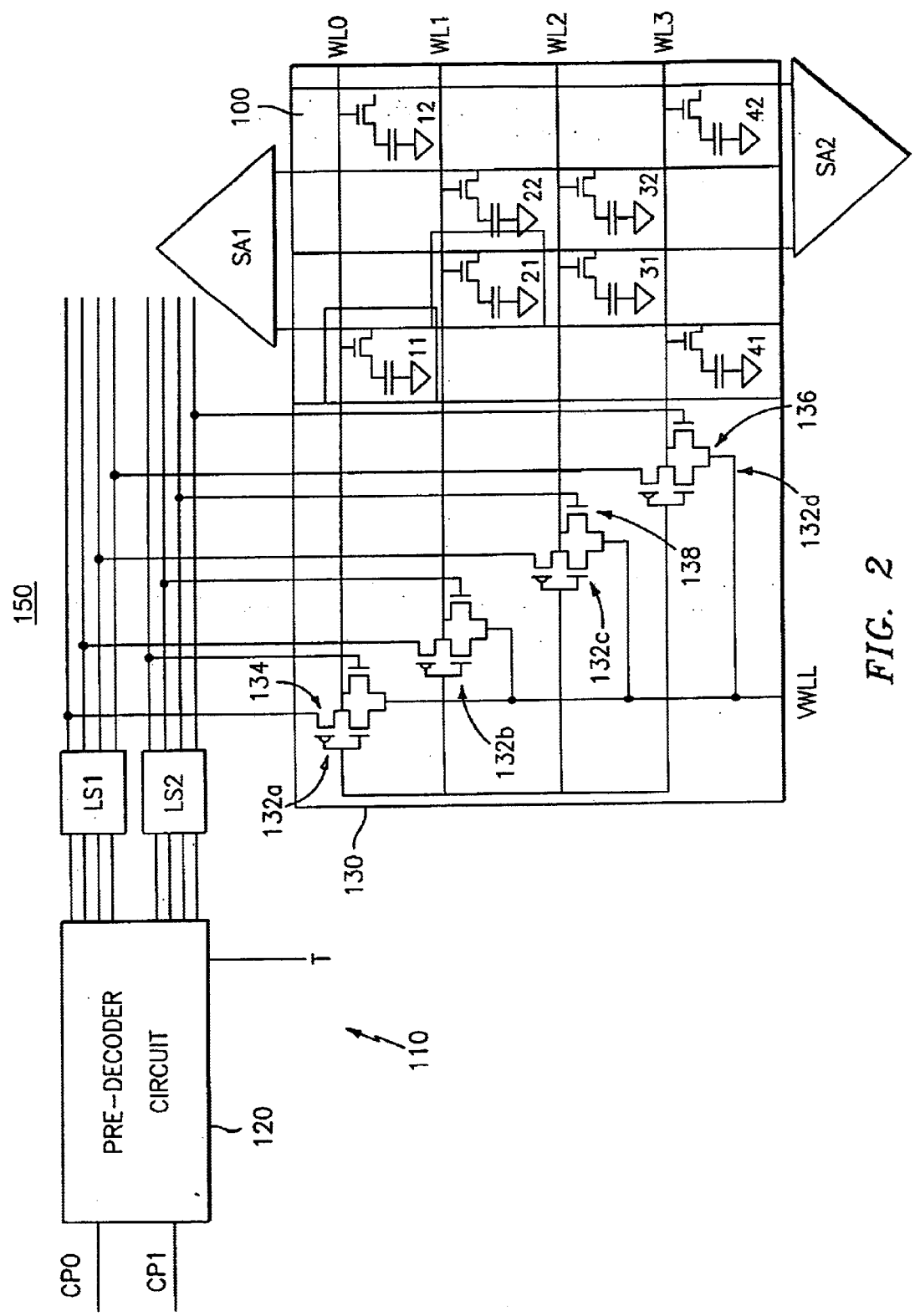
FIG. 2 is a diagram of a DRAM array capable of storing data in both the single-cell and twin-cell array format and wordline decoding circuitry for performing data conversion from one array format to another according to the present invention.

With reference to FIG. 2, there is shown a DRAM array capable of storing data in both the single-cell and twin-cell array format a DRAM array capable of storing data in both the single-cell and twin-cell array format and wordline decoding circuitry for performing data conversion from one array format to another according to the principles of the present invention. The DRAM array is designated generally by reference numeral 100. The wordline decoding circuitry is designated generally by reference numeral 110. The DRAM array 100 includes a plurality of wordlines (WLs) and bitlines (BLs) and is similar to the conventional folded bit-line array, which is well known in the art. It is, however, contemplated that other conventional array configurations may be utilized, such as the open bit-line array.

The DRAM array 100 and the wordline decoding circuitry 110 are part of a DRAM memory array system designated generally by reference numeral 150. The decoding circuitry 110 includes a pre-decoder circuit 120 which allows either one wordline activation during a data array accessing cycle (when T is a logic low signal, i.e., T=0) for single-cell array operation, or simultaneous activation of a pair of adjacent wordlines during a data array accessing cycle (when T is a logic high signal, i.e., T=1) for twin-cell array operation.

To better understand the operation of the pre-decoder circuit 120 of the present disclosure, a prior art pre-decoder circuit will now be described with reference to FIG. 1. The prior art pre-decoder circuit is designated generally by reference numeral 10. The prior art pre-decoder circuit 10 uses two lowest address bits CP0 and CP1 to decode one XP01<0>, XP01<1>, XP01<2> and XP01<3> of four wordlines in a group via its logic design. The logic design includes two inverters INVa, INVb, four NAND logic gates NAND1–NAND4, a first column of inverters INVa1–INVa4, and a second column of inverters INVb1–INVb4 for providing complementary outputs bXP01<0> to bXP01<3>. An example of selecting a single wordline out of 256 wordlines is (1) to use seven row address bits, i.e., CP2 to CP8, to decode one group from 128 four wordline groups; and (2) to use the two row address bits, i.e., CP0 and CP1, to decode one of the four wordlines in the selected group.

Since the selected wordline is switched from a negative level (or VWLL) to a boosted level (or Vpp), in the prior art and inventive wordline decoding circuitry, two level shifters LS1, LS2 are required (see FIG. 2). The first level shifter LS1 is used to convert the wordline high voltage level from Vint to Vpp level, the other level shifter LS2 is used to convert the wordline low voltage from ground to VWLL level. More specifically, the XP01<0> to XP01<3> are fed into the first level shifter LS1, while the complementary outputs bXP01<0> to bXP01<3> are fed into the second level shifter LS2.

One of the outputs of the first and second level shifter LS1, LS2 in the prior art and inventive wordline decoding circuitry is received by a wordline driver circuit 130 and the wordline driver circuit 130 selects one of the four wordline groups. The wordline driver circuit 130 includes four wordline drivers 132a–d. Each wordline driver includes a pull-up pMOS device 134, a pull-down nMOS device 136 and an nMOS killer device 138. The XP01<0> to XP01<3> are used to decode the pull-up pMOS device 134, while bXP01<0> to bXP01<3> are used to decode the nMOS killer device 138.

When a wordline is selected, its pull-up pMOS device 134 is connected to Vpp, and the gate of its nMOS killer device 138 is connected to VWLL. The sources of the pull-up pMOS devices 134 of the unselected wordlines are tied to ground and the gates of the nMOS killer devices 138 of the unselected wordlines are tied to Vdd.

I. Single-Cell Array Operation

During single-cell array operation, the voltage level of the activated wordline, for example, wordline WL0, is increased from VWLL to Vpp, while the other wordlines are maintained at VWLL. The data stored in cell 11 is then read via a top sense amplifier SA1, while the data stored in cell 12 is read via a bottom sense amplifier SA2.

II. Twin-Cell Array Operation

If the DRAM array 100 is operated as a twin-cell array, two adjacent wordlines must be activated each time. One method is to hard-wire every two adjacent wordlines together. However, this approach will turn the DRAM array 100 into an array having a permanent twin-cell array format, which is not the intention of the present disclosure.

Figure 1:
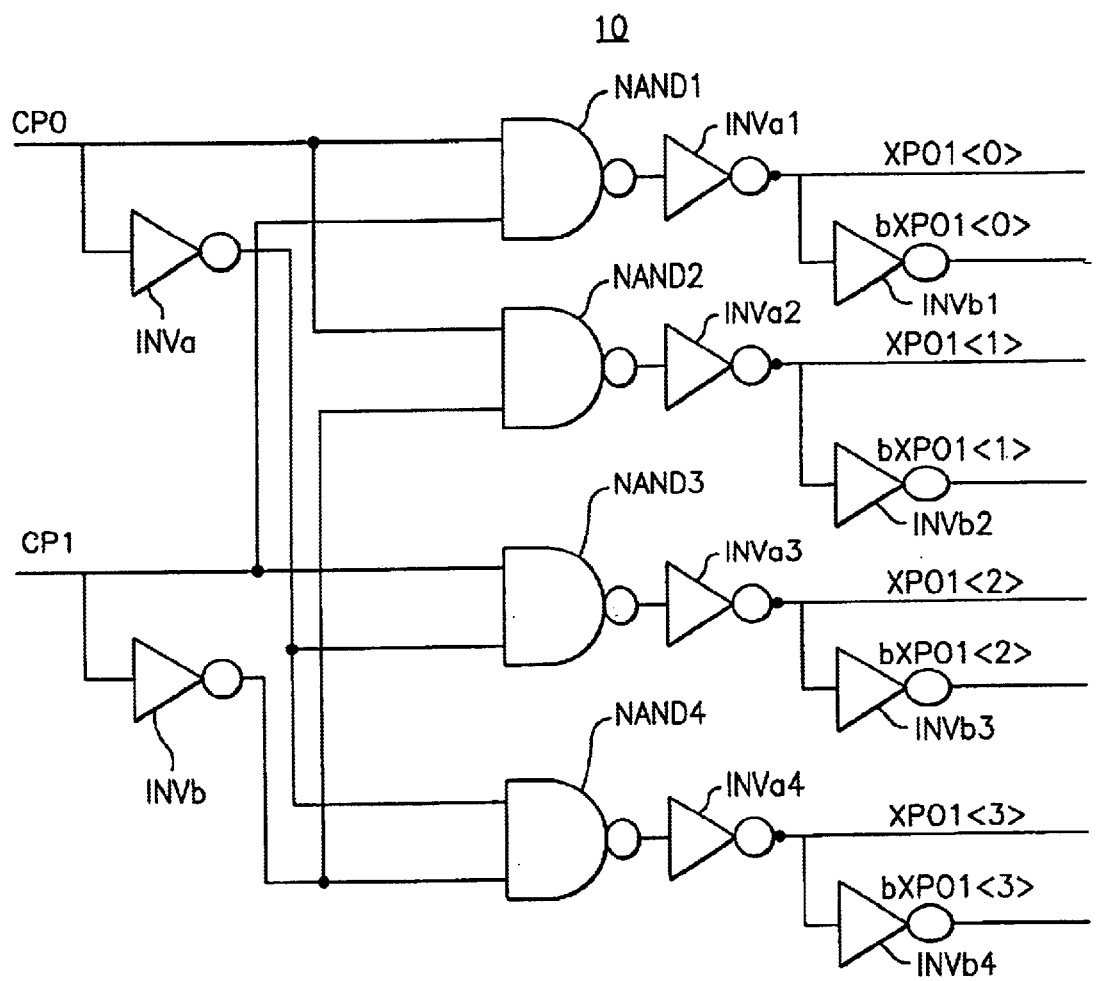
FIG. 1 is a diagram of a prior art decoding circuit for a data array.
Figure 3:
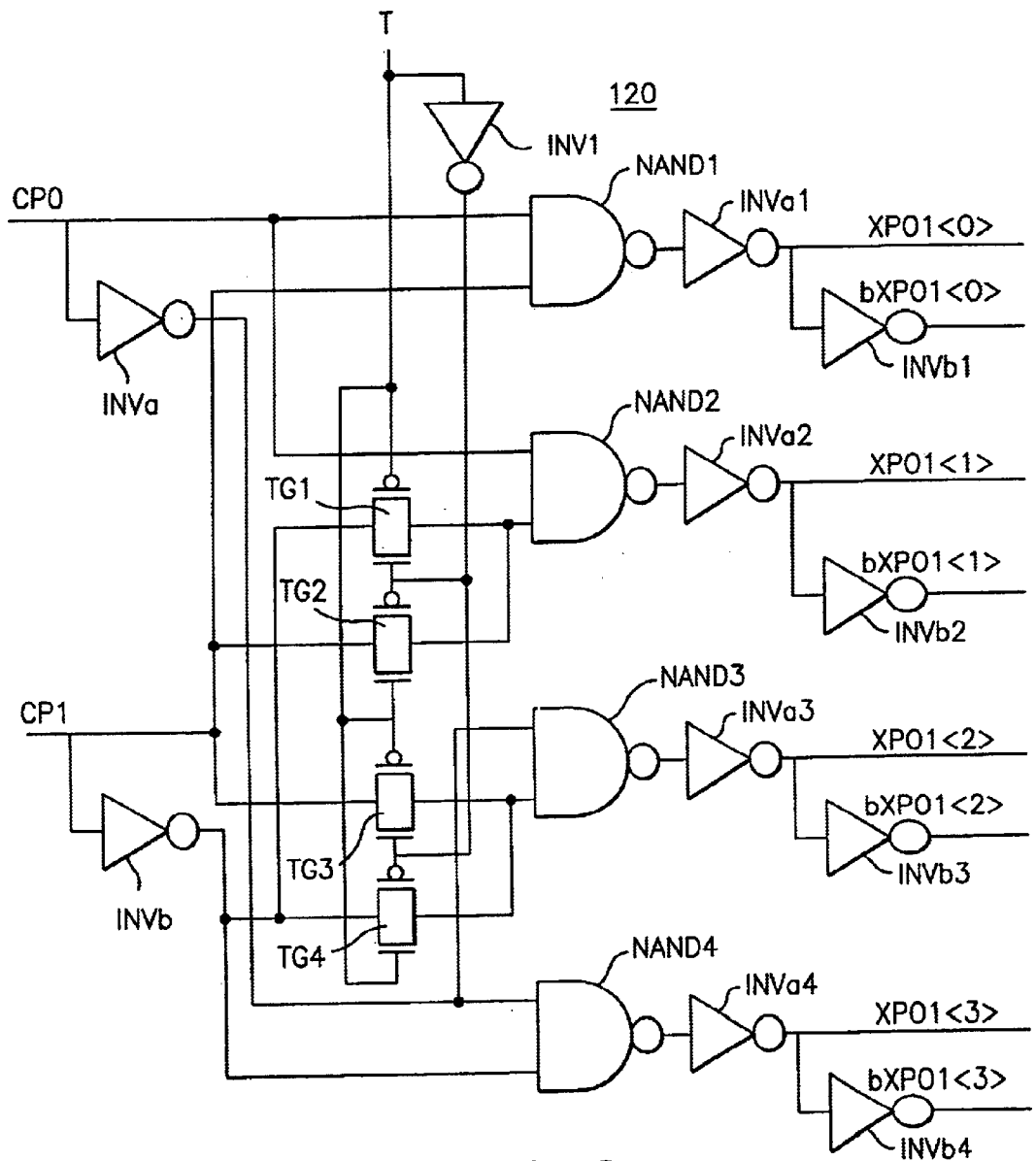
FIG. 3 is a schematic diagram of the wordline decoding circuitry shown by FIG. 2.

The present disclosure provides the pre-decoder circuit 120 which allows the DRAM array 100 to be operated in the single- and twin-cell array format based on a received control signal, unlike the prior art pre-decoder circuit 10 shown by FIG. 1. With reference to FIG. 3, a transmission gate circuit 300 having two pairs of transmission gates TG1, TG2 and TG3, TG4 and an inverter INV1 is provided to the prior art pre-decoder circuit 10 to design the pre-decoder circuit 120.

From FIG. 3 it can be observed by one skilled in the art that the logic design of the transmission gate circuit 300 enables the pre-decoder circuit 120 to activate one wordline when the control signal T is a logic low signal (i.e., T=0), and to simultaneously activate two adjacent wordlines, i.e., XP01<0> and XP01<1> or XP01<2> and XP01<3>, when the control signal T is a logic high signal (i.e., T=1).

Table 1 provides the logic outputs of the pre-decoder circuit 120 according to all possible logic inputs of the control signal T and the two lowest address bits CP0 and CP1. Twin-cell array operation occurs when CP0 and CP1 are both logic low or both logic high; this is depicted by rows five and eight in Table 1. When T=1 and either CP0 is logic low and CP1 is logic high or CP0 is logic high and CP1 is logic low, none of the wordlines of the array 100 are selected; this is depicted by rows six and seven in Table 1.

TABLE 1

Logic inputs and outputs of the pre-decoder circuit 120.

| CP0 | CP1 | T | NAND1 | NAND2 | NAND3 | NAND4 | XP01<0> | XP01<1> | XP01<2> | XP01<3> |
|---|---|---|---|---|---|---|---|---|---|---|
| 0 | 0 | 0 | 1 | 1 | 1 | 0 | 0 | 0 | 0 | 1 |
| 0 | 1 | 0 | 1 | 1 | 0 | 1 | 0 | 0 | 1 | 0 |
| 1 | 0 | 0 | 1 | 0 | 1 | 1 | 0 | 1 | 0 | 0 |
| 1 | 1 | 0 | 0 | 1 | 1 | 1 | 1 | 0 | 0 | 0 |
| 0 | 0 | 1 | 1 | 1 | 0 | 0 | 0 | 0 | 1 | 1 |
| 0 | 1 | 1 | 1 | 1 | 1 | 1 | 0 | 0 | 0 | 0 |
| 1 | 0 | 1 | 1 | 1 | 1 | 1 | 0 | 0 | 0 | 0 |
| 1 | 1 | 1 | 0 | 0 | 1 | 1 | 1 | 1 | 0 | 0 |

The pre-decoder circuit 120 of the present disclosure has a dual function; it can operate the DRAM array 100 in the single- and twin-cell array format.

For a write operation during twin-cell array operation, if both wordlines WL0 and WL1 are simultaneously activated, for example, as shown by FIG. 2, the pre-decoder circuit 120 causes the true and complementary values of data stored in a single cell to be stored in cells 11 and 22, respectively, of the DRAM array 100 via the top sense amplifier SA1. The pre-decoder circuit 120 also causes the true and complementary values of data stored in another single cell to be stored in cells 21 and 12, respectively, of the DRAM array 100 via the bottom sense amplifier SA2. Similarly, for a read operation during twin-cell array operation, if both wordlines WL0 and WL1 are activated simultaneously, for example, the true and complementary values of data stored in a single cell are read via the top sense amplifier SA1.

It is noted that since the complimentary values of data are stored and sensed for data stored in the DRAM array 100, the signal margin of the data becomes stronger. Hence, twin-cell array operation has a longer retention time than single-cell array operation, and the DRAM array 100 can be operated in the twin-cell array format using a lower voltage level.

III. Data Conversion From Single-Cell to Twin-Cell Array Format

A procedure will now be described for converting data stored within the DRAM array 100 in the single-cell array format to the twin-cell array format using the wordline decoding circuitry 110. For example, the following procedure is used to convert data stored in the single-cell array format within single-cells coupled to the wordline WL0 to the twin-cell array format, i.e., within twin-cells coupled to the wordlines WL2 and WL3.

First, data stored in the single-cells coupled to the word-line WL0, e.g., cells 11 and 12, is read and latched into the top and bottom sense amplifiers. Specifically, the data stored in cell 11 is amplified and latched to the top sense amplifier SA1, while the data stored in cell 12 is amplified and latched to the bottom sense amplifier SA2.

Second, in order to write back the data to the DRAM array 100 in the twin-cell array format, the wordlines WL2 and WL3 are selected and activated simultaneously by selecting address bits CP0=0 and CP1=0. That is, the data originally stored in cell 11 is written to cell 41 and cell 32 with its true and complementary values via top sense amplifier SA1, respectively. The data originally stored in cell 12 is written to cell 42 and cell 32 in the same way via the bottom sense amplifier SA2.

IV. Data Conversion From Twin-Cell to Single-Cell Array Format

A procedure will now be described for converting data stored within the DRAM array 100 in the twin-cell array format to the single-cell array format using the wordline decoding circuitry 110. For example, the following procedure is used to convert data stored in the twin-cell array format within the twin-cells coupled to the wordlines WL2 and WL3 to the single-cell array format, i.e., within single-cells coupled to the wordline WL1.

First, data stored in the twin-cells coupled to the word-lines WL2 and WL3 are read by activating both wordlines simultaneously; the data stored in cell 32 and cell 41 is stored in the top sense amplifier SA1, while the data stored in cell 31 and cell 42 is stored in the bottom sense amplifier SA2.

Second, data latched and stored in the sense amplifiers SA1, SA2 is now written back to wordline WL1 in a single-cell array format by activating wordline WL1 by selecting address bits CP0=1 and CP1=1; the data stored in cell 32 and cell 41 is converted to single-cell data and stored in cell 22, while the data stored in cell 31 and cell 42 is converted to single-cell data and stored in cell 21.

The data is converted from the single-cell array format to the twin-cell array format, before the memory system 150 having the DRAM array 100 enters the low-power mode. On the other hand, when the memory system 150 is awaken from the low-power mode, the data that is stored in the twin-cell array format is converted to the single-cell array format to regain the density of the memory system 150.

V. System Configurations

Figure 4:
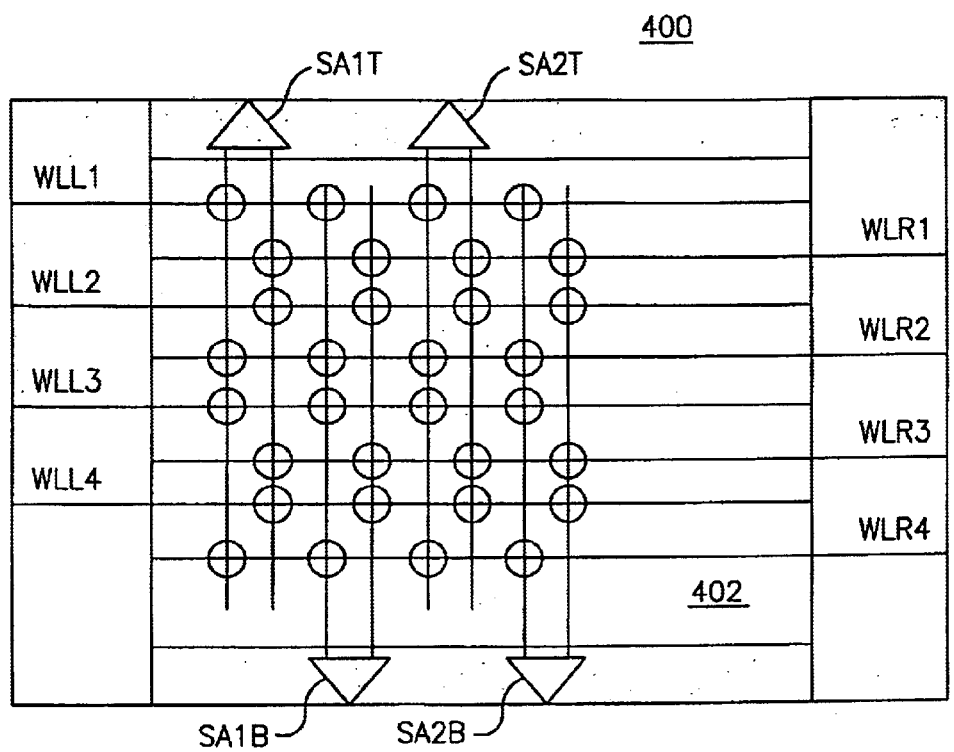
FIG. 4 is a diagram of a DRAM array system having an interleaved wordline arrangement data array capable of storing data in either the single-cell or twin-cell array format according to the present invention.

With reference to FIG. 4, there is shown a diagram of a DRAM array system designated generally by reference numeral 400. The DRAM array system 400 has an interleaved wordline arrangement data array 402 capable of storing data in either the single-cell or twin-cell array format according to the present invention. The array 402 further has bitlines connected to top sense amplifiers SA1T, SA2T and bottom sense amplifiers SA1B, SA2B.

The wordline decoding circuitry 110 described above with reference to FIGS. 2 and 3 is connected to the DRAM array system 400. The wordline decoding circuitry 110 accesses wordlines WLL1–4 from the left side of the array 402 and it accesses wordlines WLR1–4 from the right side of the array 402. In other words, the odd wordlines WLL1–4 of the array 402 are accessed from the left side of the array 402, while the even wordlines WLR1–4 are accessed from the right side of the array 402.

Accordingly, a group of wordline drivers 132 of the wordline driver circuit 130 are provided on the left side of the array 402 to drive the odd wordlines WLL1–4 and a group of wordline drivers 132 of the wordline driver circuit 130 are provided on the right side of the array 402 to drive the even wordlines WLR1–4.

In order to operate the data array 402 in the twin-cell array format, a pair of adjacent right (or left) wordlines are simultaneously activated using the wordline decoding circuitry 110 described above with reference to FIGS. 2 and 3. To operate the data array 402 in the single-cell array format, only one wordline is activated using the wordline decoding circuitry 110.

Figure 5:
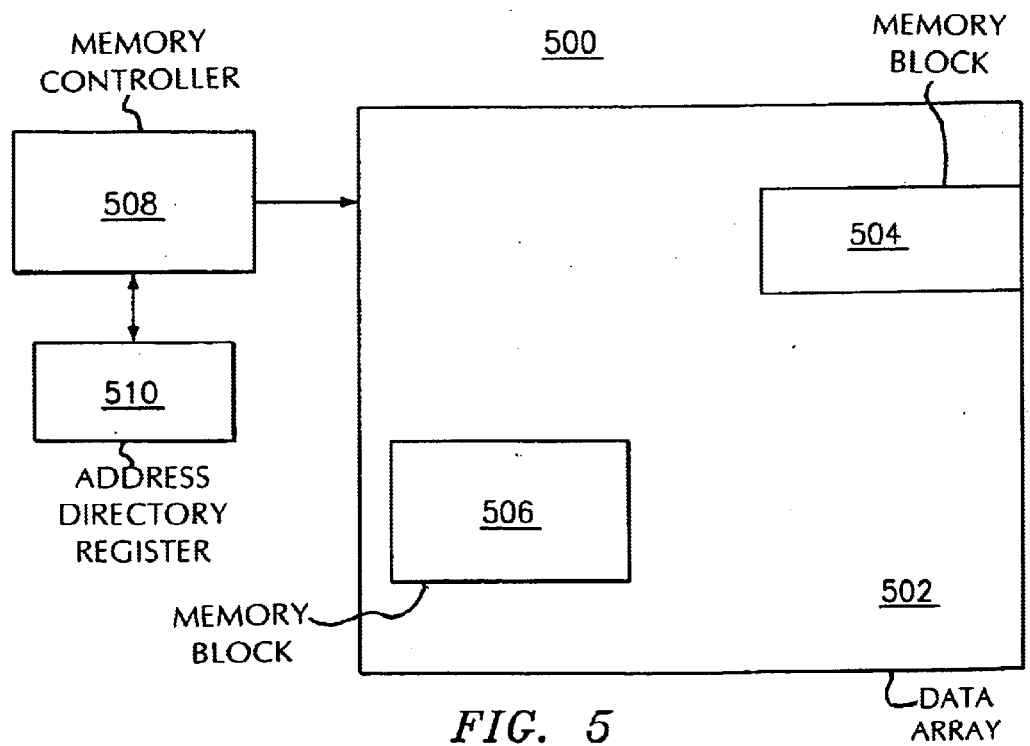
FIG. 5 is a block diagram of a memory system capable of storing data in either the single-cell or twin-cell array format and performing data conversion from one array format to another according to the present invention.

With reference to FIG. 5, there is shown a block diagram of a memory system designated generally by reference numeral 500. The memory system 500 includes a data array 502 capable of storing data in either the single-cell or twin-cell array format.

It is provided that the data array 502 can store data in one or more portions of the array 502 in the single-cell array format while simultaneously storing data in one or more portions of the array 502 in the twin-cell array format. For example, memory block 504 of the data array 502 stores data in the twin-cell array format, while memory block 506 stores data in the single-cell format. It is contemplated that the memory cells within the memory blocks 504, 506 can be interchanged or switched from single-cell array operation to twin-cell array operation, and vice versa.

The memory system 500 includes a memory controller 508 for performing data conversion from one array format to another. The memory controller 508 includes a processor for determining the location of a memory cell by accessing an address directory register 510 as known in the art. The address directory register 510 stores the address and status, i.e., single- or twin-cell array format, of each of the memory cells of the data array 502. The processor updates the address directory register 510, i.e., updates the status of each of the memory cells, following a conversion from the single-cell array format to the twin-cell array format, and vice versa.

For example, before the memory system 500 enters the sleep mode, the memory controller 508 accesses the address directory register 510 and determines which memory cells have data stored in the single-cell array format and their address. The memory controller 508 then converts these memory cells to the twin-cell array format by driving a control system, such as the wordline decoding circuitry 110 described above. The memory controller 508 then appropriately updates the address directory register 510 by the processor generating and transmitting signals thereto as known in the art.

The capability of the present invention to interchange memory cells from single-cell to twin-cell array operation is ideal for low-power applications, i.e., when the operating voltage of a memory system is reduced. Further, the refresh period of the DRAM array is extended when the DRAM array is operated as a twin-cell array, as compared to when the DRAM array is operated as a single-cell array.

In conclusion, the present invention provides a DRAM memory system or other non-volatile array memory system having a data array capable of storing data in either the single-cell or twin-cell array format, thereby making the data array suitable for high-density and low-power applications. The only additional hardware required to implement the array memory system of the present invention is the transmission gate circuitry 300 of the pre-decoder circuit 120, and the control signal T. Hence, the area overhead is minimal.

What has been described herein is merely illustrative of the application of the principles of the present invention. For example, the functions described above and implemented as the best mode for operating the present invention are for illustration purposes only. As a particular example, for instance, other design configurations may be used for the single-cell and twin-cell array configurations which provide similar operation as the array configurations described above. Other arrangements and methods may be implemented by those skilled in the art without departing from the scope and spirit of this invention.

We claim:

1. A memory array system comprising:
    a plurality of memory cells arranged in a data array having a plurality of wordlines traversing the plurality of memory cells, such that a group of the plurality of memory cells is connected to each of the plurality of wordlines;
    wordline decoding circuitry for receiving a control signal for activating a single wordline or at least two wordlines during a data array accessing cycle; and
    means for interchanging between a single-cell array and a twin-cell array mode of operation of a set of the memory cells connected to the activated wordline.

2. The memory array system according to claim 1, wherein said wordline decoding circuitry includes a pre-decoder circuit having a logic circuit for receiving the control signal and two logic inputs and outputting at least one wordline selection signal to wordline activating means.

3. The memory array system according to claim 2, wherein said logic circuit includes two pairs of transmission gates and first and second NAND logic gates coupled to a respective pair of the two pairs of transmission gates, wherein each pair of transmission gates receives the control signal, one of the two logic inputs, and an inverse input of one of the two logic inputs.

4. The memory array system according to claim 2, wherein said wordline activating means includes a first and a second line shifter and a wordline driver circuit having wordline drivers for activating a respective one of the plurality of wordlines.

5. The memory array system according to claim 1,
    wherein said wordline decoding circuitry includes the means for interchanging between the single-cell array and the twin-cell array modes of operation of the set of memory cells.

6. The memory array system according to claim 1, wherein in said single-cell array mode of operation data is stored in a single-cell array format and in said twin-cell array mode of operation data is stored in a twin-cell array format.

7. The memory array system according to claim 1, wherein said plurality of wordlines have an interleaved arrangement, wherein a group of wordlines of the plurality of wordlines are activated from a left side of the data array and a group of wordlines of the plurality of wordlines are activated from a right side of the data array.

8. The memory array system according to claim 1, further comprising an address directory register for storing the address of each memory cell operating in a single-cell array mode of operation and the address of each memory cell operating in a twin-cell array mode of operation.

9. The memory array system according to claim 1, wherein the memory cells are selected from the group consisting of DRAM and TRAM cells.

10. A memory array system comprising;
    a plurality of memory cells arranged in an array having a plurality of wordlines traversing the plurality of memory cells;
    a memory controller having means for accessing an address directory register storing an address and a status of each of the plurality of memory cells, said memory controller further having means for determining the address and status of at least one of the plurality of memory cells and means for activating a single wordline or at least two wordlines during a data array accessing cycle; and means for interchanging cells between a single-cell array and a twin-cell array mode of operation of at least one of the plurality of memory cells.

11. The memory array system according to claim 10, wherein said memory controller further comprises means for updating the status of the at least one of the plurality of memory cells.

12. The memory array system according to claim 10, wherein in said single-cell array mode of operation data is stored in a single-cell array format and in said twin-cell array mode of operation data is stored in a twin-cell array format.

13. The memory array system according to claim 10, wherein the memory cells are selected from the group consisting of DRAM and TRAM cells.

14. Wordline decoding circuitry for controlling wordline activation for a memory array having a plurality of memory cells, said wordline decoding circuitry comprising:

circuitry for receiving at least one control signal;

wordline activation circuitry for enabling single wordline activation or dual wordline activation according to said received at least one control signal; and circuitry for interchanging between a single-cell and a twin-cell array mode of operation of at least one memory cell.

15. Wordline decoding circuitry according to claim 14, wherein said wordline activation circuitry includes the circuitry for interchanging between the single-cell array and the twin-cell array mode of operation of the at least one memory cells, and wherein in said single-cell array mode of operation data is stored in a single-cell array format and in said twin-cell array mode of operation data is stored in a twin-cell array format.

16. Wordline decoding circuitry according to claim 14, wherein the at least one memory cell is selected from the group consisting of DRAM and TRAM cells.

\* \* \* \* \*